(12) United States Patent
Yamamoto et al.

(10) Patent No.: US 12,287,286 B2
(45) Date of Patent: Apr. 29, 2025

(54) INSPECTION DEVICE

(71) Applicants:MITSUBISHI HEAVY INDUSTRIES, LTD., Tokyo (JP); RIKEN, Saitama (JP)

(72) Inventors: Syusaku Yamamoto, Tokyo (JP); Keisuke Kajikawa, Tokyo (JP); Yuichiro Kamino, Tokyo (JP); Hiroaki Minamide, Saitama (JP); Koji Nawata, Saitama (JP)

(73) Assignees: MITSUBISHI HEAVY INDUSTRIES, LTD., Tokyo (JP); RIKEN, Saitama (JP)

( * ) Notice: Subject to any disclaimer, the term of this patent is extended or adjusted under 35 U.S.C. 154(b) by 243 days.

(21) Appl. No.: 18/170,865

(22) Filed: Feb. 17, 2023

(65) Prior Publication Data

US 2023/0288327 A1 Sep. 14, 2023

(30) Foreign Application Priority Data

Mar. 9, 2022 (JP) ................................. 2022-036204

(51) Int. Cl.
*G01N 21/21* (2006.01)
*G01N 21/3581* (2014.01)
*G01N 21/47* (2006.01)

(52) U.S. Cl.
CPC ......... *G01N 21/3581* (2013.01); *G01N 21/21* (2013.01); *G01N 2021/216* (2013.01); *G01N 2021/4709* (2013.01); *G01N 2021/4792* (2013.01)

(58) Field of Classification Search
None
See application file for complete search history.

(56) References Cited

U.S. PATENT DOCUMENTS

| | | | | |
|---|---|---|---|---|
| 6,439,720 B1* | 8/2002 | Graves | ................... | A61B 3/103 |
| | | | | 351/211 |
| 6,495,833 B1* | 12/2002 | Alfano | ............... | G01N 21/4795 |
| | | | | 250/341.8 |
| 7,460,248 B2* | 12/2008 | Kurtz | ................. | G01N 21/6458 |
| | | | | 356/497 |
| 7,612,880 B2* | 11/2009 | Chipman | ............. | A61B 3/1225 |
| | | | | 356/369 |
| 8,107,077 B2* | 1/2012 | Tamada | .................... | G01J 3/02 |
| | | | | 356/369 |
| 8,199,323 B2* | 6/2012 | Baravian | ................ | G01N 21/21 |
| | | | | 250/225 |

(Continued)

FOREIGN PATENT DOCUMENTS

| | | | |
|---|---|---|---|
| JP | 3940336 B2 | * | 7/2007 |
| JP | 2020-026991 A | | 2/2020 |
| KR | 20210076598 A | * | 6/2021 |

*Primary Examiner* — Thomas R Artman
(74) *Attorney, Agent, or Firm* — Osha Bergman Watanabe & Burton LLP (57) ABSTRACT

An inspection device includes: a light source for outputting pulsed excitation light with a time width of 10 picoseconds to 10 nanoseconds; a nonlinear optical crystal for generating a terahertz wave by optical wavelength conversion of the pulsed excitation light; a polarization part for reflecting at least a part of a reflected wave of the terahertz wave reflected by an inspection target; and a detector for detecting the reflected wave reflected by the polarization part.

8 Claims, 10 Drawing Sheets

(56) References Cited

U.S. PATENT DOCUMENTS

| | | | | |
|---|---|---|---|---|
| 8,597,283 B2* | 12/2013 | Bischoff | ............... | A61B 3/107 351/215 |
| 9,134,182 B2* | 9/2015 | Itsuji | ................... | G01N 21/3581 |
| 2002/0047992 A1* | 4/2002 | Graves | ................... | G02B 26/06 351/212 |
| 2007/0146632 A1* | 6/2007 | Chipman | ................... | G01J 4/04 351/205 |
| 2007/0263226 A1* | 11/2007 | Kurtz | ............... | G01N 21/4795 356/492 |
| 2008/0062429 A1* | 3/2008 | Liang | ..................... | A61B 1/043 356/497 |
| 2008/0118886 A1* | 5/2008 | Liang | ................... | A61B 5/0088 433/29 |
| 2009/0303480 A1* | 12/2009 | Tamada | .................... | G01J 3/02 356/369 |
| 2010/0067006 A1* | 3/2010 | Baravian | ................ | G01N 21/21 356/338 |
| 2011/0224658 A1* | 9/2011 | Bischoff | ................ | A61B 3/107 351/215 |
| 2013/0334421 A1* | 12/2013 | Itsuji | ........................ | G01J 3/42 250/341.8 |
| 2015/0316832 A1* | 11/2015 | Sato | ...................... | G02F 1/0136 359/326 |
| 2016/0183801 A1* | 6/2016 | Hogan | ............... | A61B 5/14532 600/425 |
| 2023/0288326 A1* | 9/2023 | Yamamoto | ......... | G01N 21/3581 |
| 2023/0288327 A1* | 9/2023 | Yamamoto | ............ | H01S 3/0092 |

* cited by examiner

In absence of crack

Polarized light does not change

FIG. 7B

In presence of crack

Polarized light changes

INSPECTION DEVICE

TECHNICAL FIELD

The present disclosure relates to an inspection device.

This application claims the priority of Japanese Patent Application No. 2022-036204 filed on Mar. 9, 2022, the content of which is incorporated herein by reference.

BACKGROUND

Patent Document 1 discloses a reflective terahertz wave measuring device (inspection device) configured to emit a terahertz wave which is one kind of electromagnetic waves to a surface of a structure, and is configured to detect the terahertz wave reflected from the structure. Such terahertz wave measuring device includes a terahertz wave transmitter serving as a terahertz wave transmitting means, and a terahertz wave detector serving as a terahertz wave detecting means. In such terahertz wave measuring device, a terahertz wave generating element with a resonant tunneling diode (RTD) etc. or a photoconductive antenna (PCA) is used for the terahertz wave transmitter, and a terahertz wave detection element composed of the RTD is used for the terahertz wave transmitter.

CITATION LIST

Patent Literature

Patent Document 1: JP2020-26991A

SUMMARY

However, in the conventional configuration shown in Patent Document 1, since the terahertz wave transmitter is composed of the semiconductor device such as the RTD or the PCA, the terahertz wave transmitted by the terahertz wave transmitter is weak and the SN ratio (signal noise ratio) is low, making it difficult to inspect an inspection target located in a lower layer of a low-permeable material.

On the other hand, if the light source is constituted by a beam light source such as a chip laser, a terahertz wave is obtained which is stronger (higher output) than the terahertz wave emitted from the semiconductor device, making it possible to inspect the inspection target located in the lower layer of the low-permeable material. The backscatter component (unwanted component) reflected by a surface of the low-permeable material is stronger than a reflection component (signal component) reflected by the inspection target, and thus the reflection component (signal component) reflected by the inspection target is hidden behind the backscatter component (unwanted component) reflected by the surface of the low-permeable material, making the inspection of the inspection target difficult.

In view of the above-described problems, an object of at least one embodiment the present invention is to provide the inspection device capable of inspecting the inspection target located in the lower layer of the low-permeable material.

An inspection device according to at least one embodiment of the present invention includes: a light source for outputting pulsed excitation light with a time width of 10 picoseconds to 10 nanoseconds; a nonlinear optical crystal for generating a terahertz wave by optical wavelength conversion of the pulsed excitation light; a polarization part for reflecting at least a part of a reflected wave of the terahertz wave reflected by an inspection target; and a detector for detecting the reflected wave reflected by the polarization part.

According to at least one embodiment of the present invention, a backscatter component (unwanted component) reflected by a surface of a low-permeable material is transmitted through a polarization part, and a reflection component (signal component) reflected by an inspection target located in a lower layer of the low-permeable material is reflected by the polarization part. Consequently, the backscatter component (unwanted component) reflected by the surface of the low-permeable material and the reflection component (signal component) reflected by the inspection target are separated from each other. Thus, the reflection component (signal component) from the inspection target can be detected by a detector, making it possible to inspect the inspection target.

DETAILED DESCRIPTION

Some embodiments of the present invention will be described below with reference to the accompanying drawings. It is intended, however, that unless particularly identified, dimensions, materials, shapes, relative positions and the like of components described or shown in the drawings as the embodiments shall be interpreted as illustrative only and not intended to limit the scope of the present invention.

Embodiment 1

[Configuration of Inspection Device According to Embodiment 1]

Figure 1:
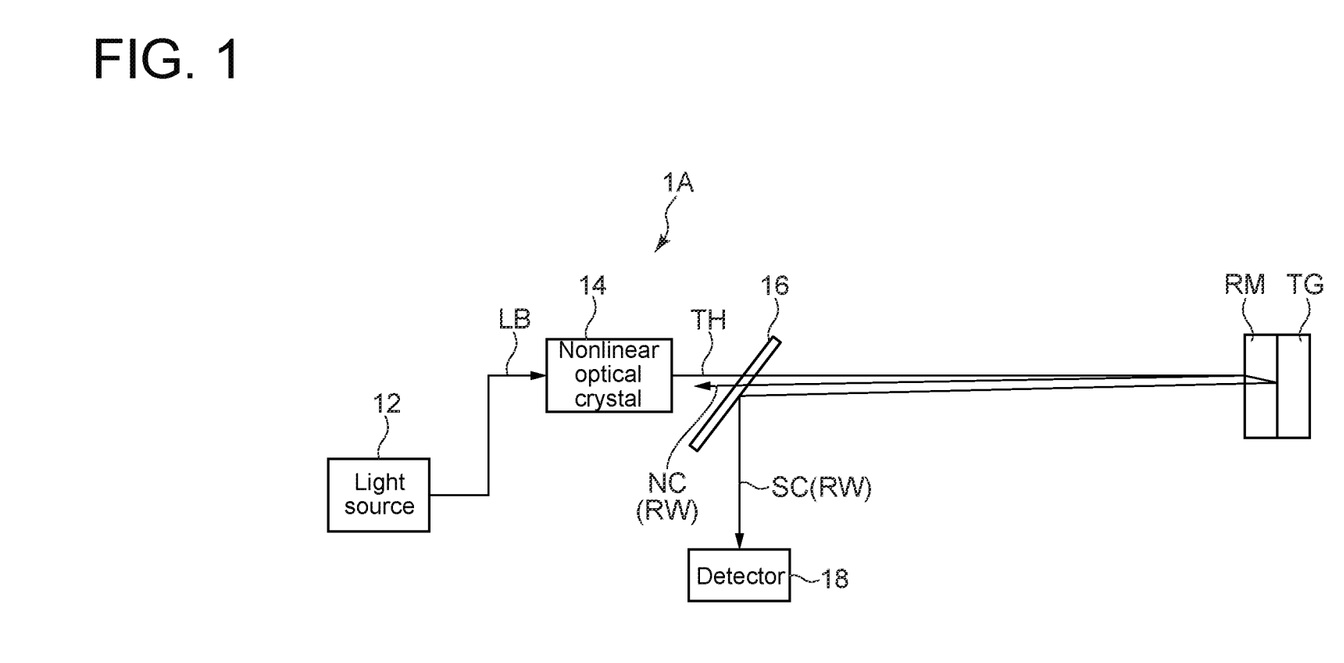
FIG. 1 is a view schematically showing the configuration of an inspection device according to Embodiment 1.

As shown in FIG. 1, an inspection device 1A according to Embodiment 1 is configured to inspect an inspection target TG covered with a low-permeable material RM. The low-permeable material RM is, for example, black rubber. The inspection device 1A includes a light source 12 for outputting pulsed excitation light LB with a time width of 10 picoseconds to 10 nanoseconds, a nonlinear optical crystal 14 for generating a terahertz wave TH by optical wavelength conversion of the pulsed excitation light LB, a polarization part 16 for reflecting at least a part of a reflected wave RW of the terahertz wave TH reflected by the inspection target TG, and a detector 18 for detecting the reflected wave RW reflected by the polarization part 16.

The light source 12 is configured to output the pulsed excitation light LB, and the pulsed excitation light LB is output with a pulse time width of, for example, not greater than 1 microsecond, preferably not greater than 1 nanosecond. The light source 12 is constituted by, for example, a beam light source such as a chip laser. The nonlinear optical crystal 14 is, for example, a periodically poled lithium niobate ($LiNbO_3$) crystal, and the periodically poled lithium niobate crystal generates the terahertz wave TH by the backward terahertz wave TH oscillation. The terahertz wave TH is an electromagnetic wave having a frequency in the vicinity of $10^{12}$ Hz (1 trillion hertz) (0.1 to 100 THz).

The polarization part 16 separates a backscatter component (unwanted component) NC reflected by a surface of the low-permeable material RM and a reflection component (signal component) SC reflected by the inspection target TG located in a lower layer of the low-permeable material RM, by using a difference in plane of polarization between the backscatter component (unwanted component) NC and the reflection component (signal component) SC (birefringence characteristics). For example, black rubber includes a stretching process in its production process, is solidified while being stretched in any one direction, and thus has different refractive indices in the in-plane direction (has a transmission axis and an absorption axis). Thus, the plane of polarization of the backscatter component NC reflected by the surface of the black rubber is the same as that of the incident terahertz wave TH, but the plane of polarization of the reflection component SC reflected by the inspection target TG is a plane of polarization rotated from the plane of polarization of the incident terahertz wave TH. Therefore, in the polarization part 16, a polarizer is disposed so as to remove the backscatter component (unwanted component) NC reflected by the surface of the black rubber, thereby extracting the reflection component (signal component) SC reflected by the inspection target TG.

For example, the polarization part 16 is constituted by a polarizer such as a wire grid. The wire grid is configured to transmit a p-polarized component and reflect an s-polarized component by forming a fine metal grid (slit), and in the present embodiment, the reflection component (signal component) SC reflected by the inspection target TG is extracted by arranging such that the backscatter component (unwanted component) NC is transmitted through the grid and the reflection component (signal component) SC is reflected.

[Operation of Inspection Device 1A]

In the inspection device 1A according to Embodiment 1, in the inspection of the inspection target TG, the light source 12 outputs the pulsed excitation light LB with the time width of 10 picoseconds to 10 nanoseconds. The pulsed excitation light LB is optically wavelength-converted into the terahertz wave TH by being transmitted through the nonlinear optical crystal 14, and is emitted to the low-permeable material RM and the inspection target TG located in the lower layer of the low-permeable material RM. The backscatter component (unwanted component) NC reflected by the surface of the low-permeable material RM is transmitted through the polarization part 16, and the reflection component (signal component) SC reflected by the inspection target TG located in the lower layer of the low-permeable material RM is reflected by the polarization part 16. Consequently, the backscatter component (unwanted component) NC reflected by the surface of the low-permeable material RM is removed, and the reflection component (signal component) SC from the inspection target TG is extracted. Thus, the reflection component (signal component) SC from the inspection target TG is detected by the detector 18 and is used for the inspection of the inspection target TG.

[Effect of Inspection Device 1A]

With the inspection device 1A according to Embodiment 1, since the backscatter component (unwanted component) NC reflected by the surface of the low-permeable material RM is transmitted through the polarization part 16 and the reflection component (signal component) SC reflected by the inspection target TG located in the lower layer of the low-permeable material RM is reflected by the polarization part 16, the backscatter component (unwanted component) NC reflected by the surface of the low-permeable material RM is removed and the reflection component (signal component) SC from the inspection target TG is extracted. Thus, the detector 18 can detect the reflection component (signal component) SC reflected by the inspection target TG hidden behind the backscatter component (unwanted component) reflected by the surface of the low-permeable material RM, making it possible to inspect the inspection target TG.

Embodiment 2

[Configuration of Inspection Device According to Embodiment 2]

Figure 2:
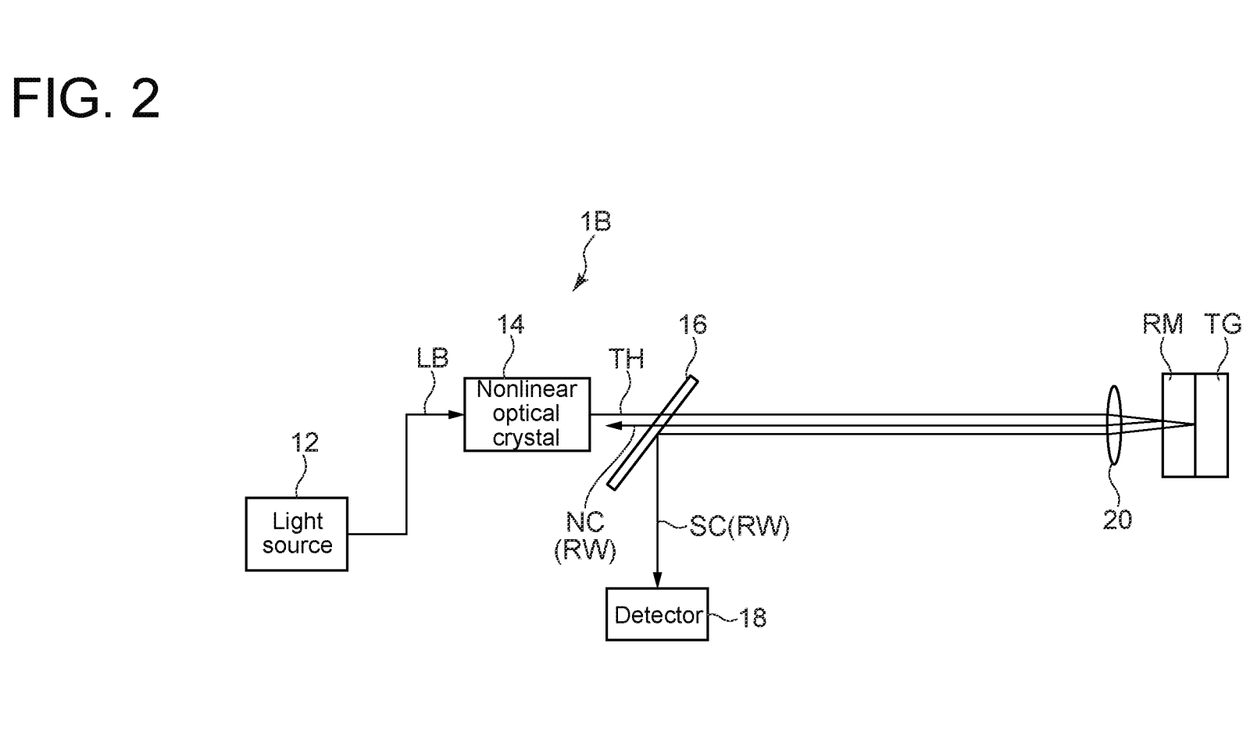
FIG. 2 is a view schematically showing the configuration of an inspection device according to Embodiment 2.

As shown in FIG. 2, an inspection device 1B according to Embodiment 2 includes, between the nonlinear optical crystal 14 and the inspection target TG, a condenser lens 20 for collecting the terahertz wave TH to irradiate the inspection target TG with the terahertz wave TH. Other configurations are the same as those of the inspection device 1A according to Embodiment 1.

[Operation of Inspection Device 1B]

In the inspection device 1B according to Embodiment 2, in the inspection of the inspection target TG, the terahertz wave TH is collected by the condenser lens 20 and emitted to the inspection target TG. Thus, the terahertz wave TH is collected to the inspection target TG, and the reflection component (signal component) SC with high resolution can be detected in the detector 18. Other operations, that is, an operation until the terahertz wave TH enters the condenser lens 20 and an operation until the reflection component (signal component) SC is detected by the detector 18 and used for the inspection of the inspection target TG are the same as those of the inspection device 1A according to Embodiment 1.

Embodiment 3

[Configuration of Inspection Device According to Embodiment 3]

Figure 3:
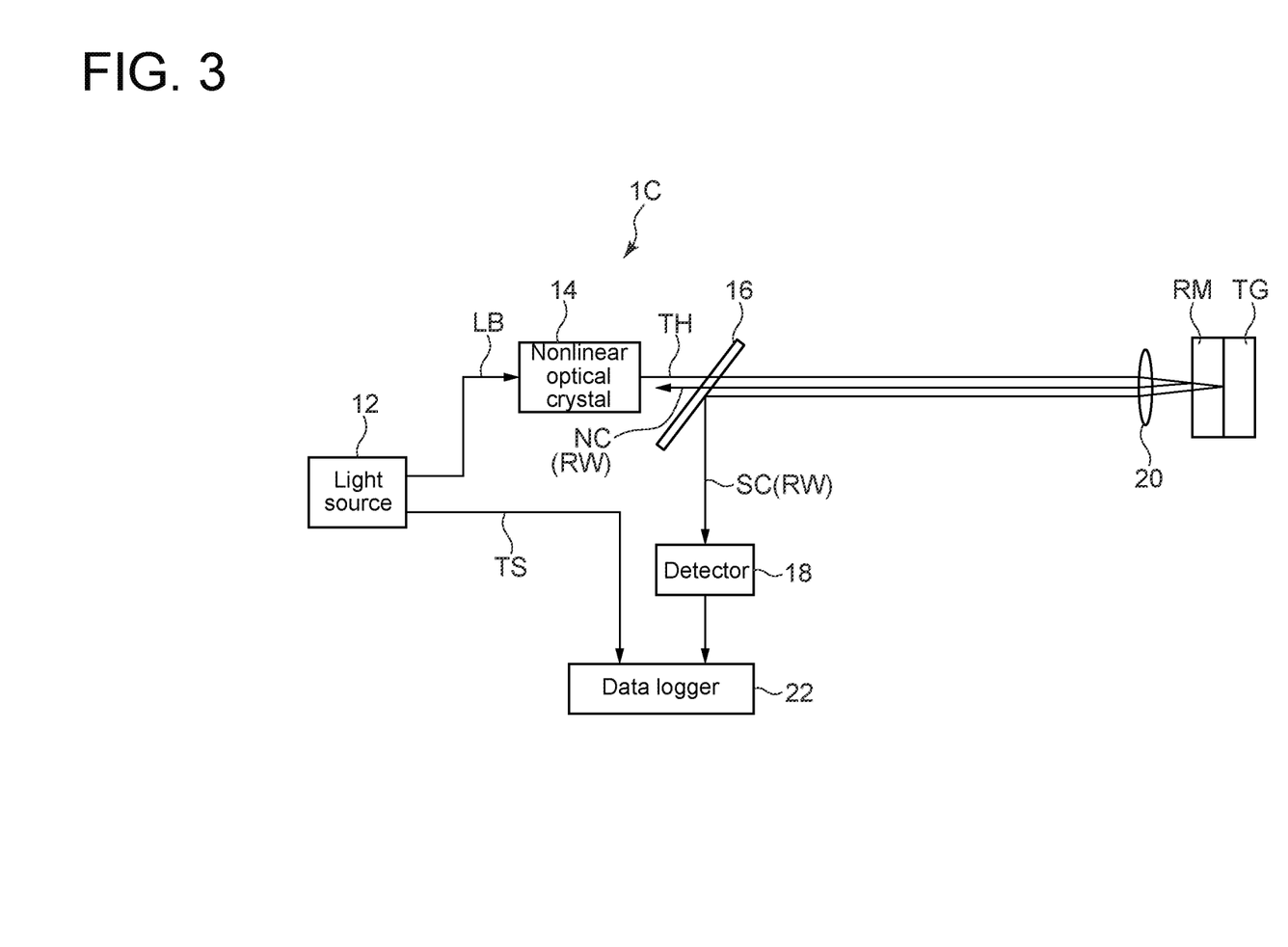
FIG. 3 is a view schematically showing the configuration of an inspection device according to Embodiment 3.

As shown in FIG. 3, an inspection device 1C according to Embodiment 3 includes a data logger 22 for storing data of the reflection component (signal component) SC detected by the detector 18. A trigger signal TS is transmitted to the data logger 22 simultaneously with the output of the pulsed excitation light LB from the light source 12, and the data logger 22 is configured to store the data of the reflection component (signal component) SC when receiving the trigger signal TS. Other configurations are the same as those of the inspection device 1A or 1B according to Embodiment 1 or 2.

[Operation of Inspection Device 1C]

In the inspection device 1C according to Embodiment 3, in the inspection of the inspection target TG, the data logger 22 stores the data of the reflection component (signal component) SC detected by the detector 18, when receiving the trigger signal TS transmitted simultaneously with the output of the pulsed excitation light LB from the light source 12. Thus, the data amount of the reflection component (signal component) SC stored in the data logger 22 can be reduced compared to a case where the data logger 22 continuously stores the data of the reflection component (signal component) SC. Other operations, that is, operations until the reflection component (signal component) SC is detected by the detector 18 are the same as those of the inspection devices 1A or 1B according to Embodiment 1 or 2.

Embodiment 4

[Configuration of Inspection Device According to Embodiment 4]

Figure 4:
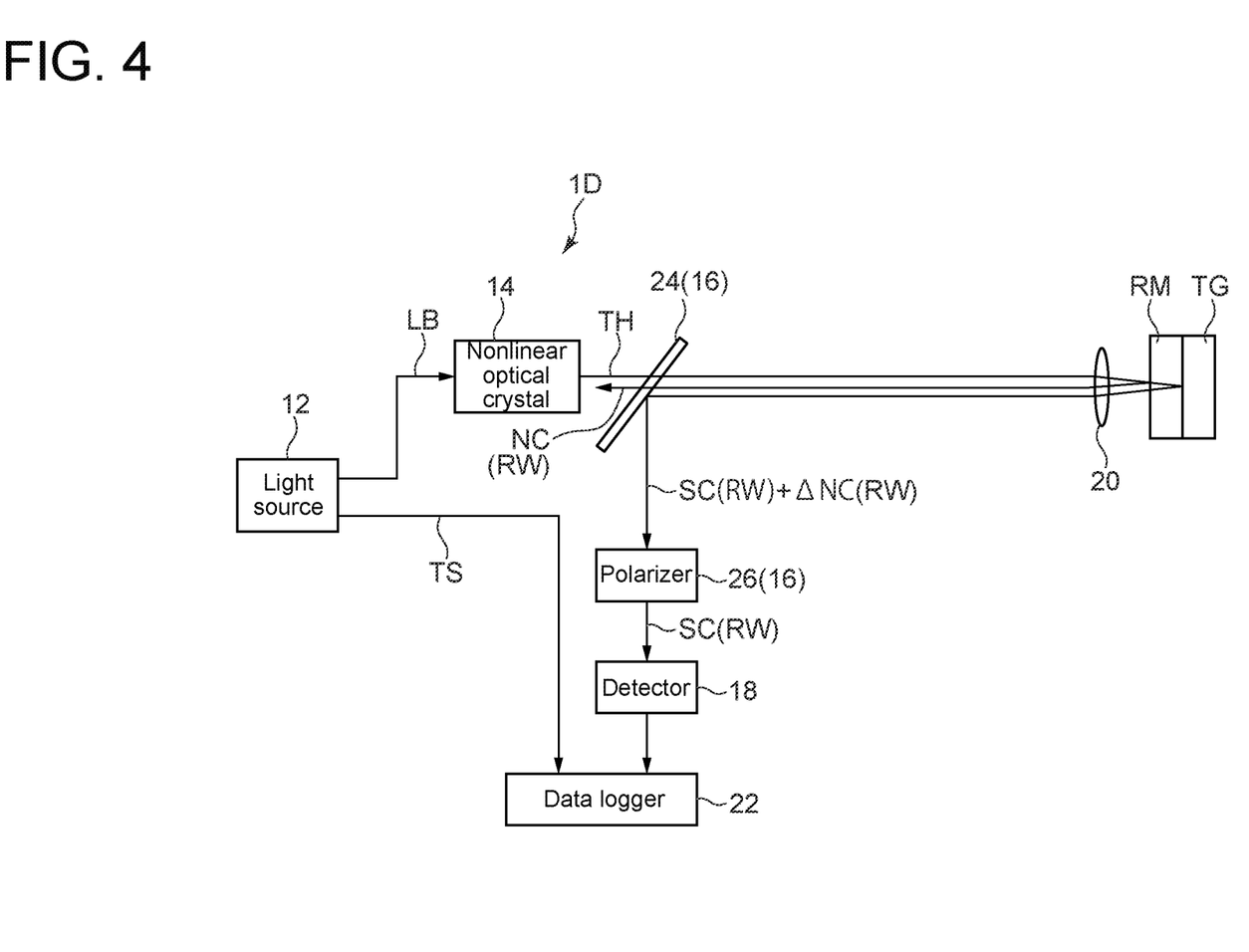
FIG. 4 is a view schematically showing the configuration of an inspection device according to Embodiment 4.

As shown in FIG. 4, in an inspection device 1D according to Embodiment 4, the terahertz wave TH is a linearly polarized wave, and the polarization part 16 includes a first polarizer 24 for reflecting a component of the reflected wave RW having a plane of polarization different from the plane of polarization of the terahertz wave TH, and a second polarizer 26 for transmitting the component reflected by the first polarizer 24. The first polarizer 24 is configured to extract the reflection component (signal component) SC reflected by the inspection target TG by the same principle configuration as the polarization part 16 described above, and the second polarizer 26 is configured to transmit the extracted reflection component (signal component) SC. For example, the first polarizer 24 and the second polarizer 26 are each constituted by a wire grid. Other configurations are the same as those of any of the inspection devices 1A, 1B, 1C according to Embodiments 1 to 3.

[Operation of Inspection Device 1D]

In the inspection device 1D according to Embodiment 4, in the inspection of the inspection target TG, most of the backscatter component (unwanted component) NC reflected by the surface of the low-permeable material RM is transmitted through the first polarizer 24, and the reflection component (signal component) SC reflected by the inspection target TG located in the lower layer of the low-permeable material RM is reflected by the first polarizer 24. Consequently, most of the backscatter component (unwanted component) NC reflected by the surface of the low-permeable material RM is removed, and the reflection component (signal component) SC reflected by the inspection target TG is extracted. Then, the reflection component (SC) reflected by the inspection target TG is transmitted through the second polarizer 26, thereby removing an unwanted component (backscatter component) ANC that has not been removed by the first polarizer 24. Consequently, noise of the reflection component (signal component) SC reflected by the inspection target TG is reduced and detection accuracy of the detector 18 is improved, allowing for highly accurate inspection. Other operations, that is, operations until the backscatter component (unwanted component) NC reflected by the surface of the low-permeable material RM and the reflection component reflected by the inspection target TG located in the lower layer of the low-permeable material RM enter the polarization part 16 (first polarizer 24) are the same as those of any of the inspection devices 1A, 1B, 1C according to Embodiments 1 to 3.

Embodiment 5

[Configuration of Inspection Device According to Embodiment 5]

Figure 5:
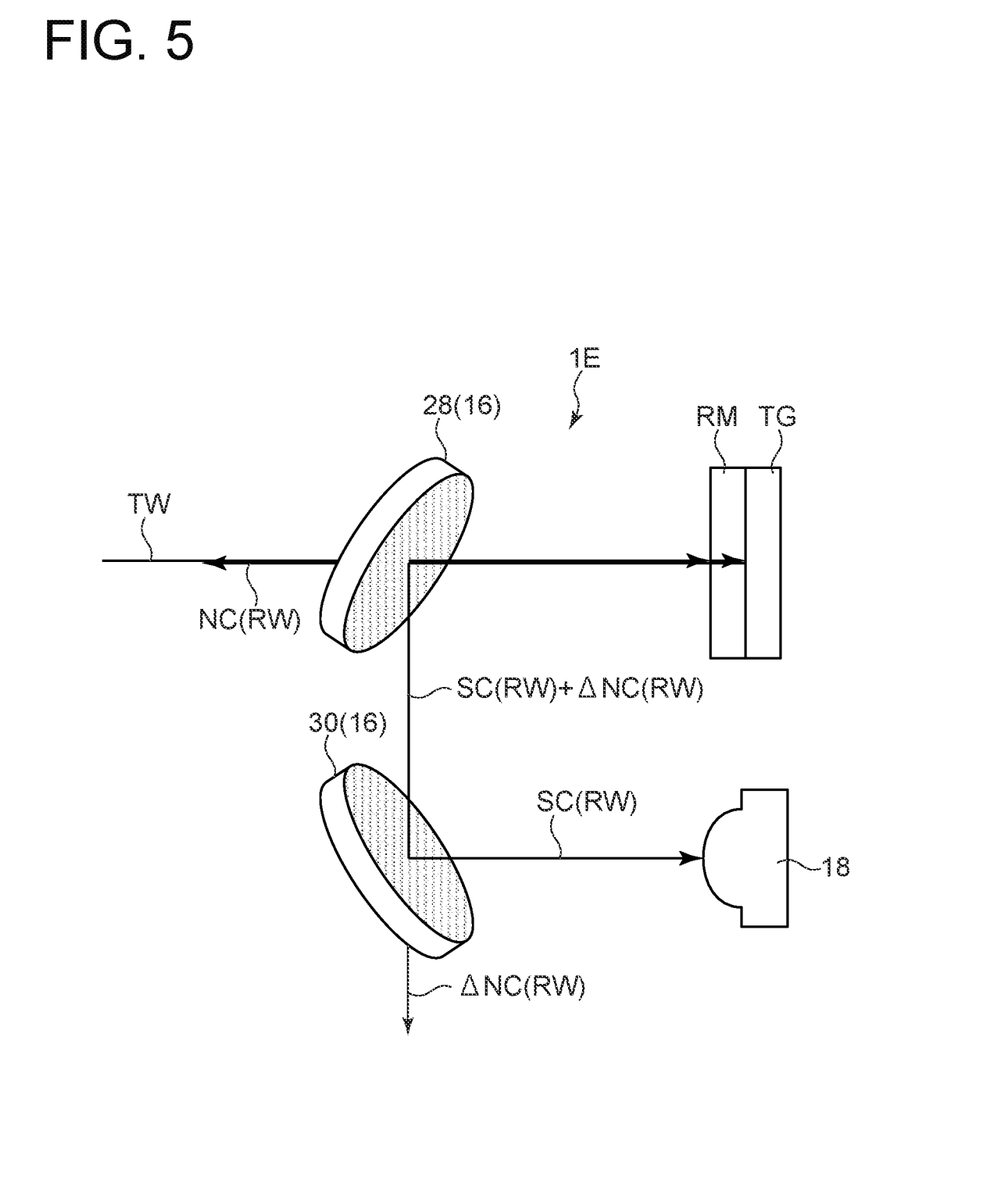
FIG. 5 is a view schematically showing the main part configuration of an inspection device according to Embodiment 5.

As shown in FIG. 5, in an inspection device 1E according to Embodiment 5, the terahertz wave TH is a linearly polarized wave, and the polarization part 16 includes a first polarizer 28 for reflecting a component of the reflected wave RW having a plane of polarization different from the plane of polarization of the terahertz wave TH, and a second polarizer 30 for reflecting the component reflected by the first polarizer 28. The first polarizer 28 is configured to extract the reflection component (signal component) SC reflected by the inspection target TG by the same principle configuration as the polarization part 16 described above, and the second polarizer 30 is configured to reflect the component (signal component) SC reflected by the first polarizer 28. For example, the first polarizer 28 and the second polarizer 30 are each constituted by a wire grid. Other configurations are the same as those of any of the inspection devices 1A, 1B, 1C according to Embodiments 1 to 3.

[Operation of Inspection Device 1E]

In the inspection device 1E according to Embodiment 5, the unwanted component (backscatter component) ΔNC that has not been separated by the first polarizer 28 is transmitted through the second polarizer 30, and the reflection component (signal component) SC reflected by the inspection target TG is reflected by the second polarizer 30. Consequently, most of the backscatter component (unwanted component) NC reflected by the surface of the low-permeable material RM is removed, and the reflection component (signal component) SC reflected by the inspection target TG is extracted. Then, the reflection component (SC) reflected by the inspection target TG is reflected by the second polarizer 26, thereby removing the unwanted component (backscatter component) ANC that has not been removed by the first polarizer 24. Mie scattering light (unwanted wave) generated by the first polarizer 28 (wire grid) is smaller in backward scatter (equivalent to reflection from the viewpoint of the second polarizer 30) than in forward scatter (equivalent to transmission in the second polarizer 30), allowing the Mie scattering light generated by the first polarizer 28 to be less picked up. Consequently, the noise of the reflection component reflected by the inspection target TG is reduced and the detection accuracy of the detector 18 is improved, allowing for highly accurate inspection. Other operations, that is, operations until the backscatter component (unwanted component) NC reflected by the surface of the low-permeable material RM and the reflection component reflected by the inspection target TG located in the lower layer of the low-permeable material RM enter the polarization part 16 (first polarizer 28) are the same as those of any of the inspection devices 1A, 1B, 1C according to Embodiments 1 to 3.

Embodiment 6

[Configuration of Inspection Device According to Embodiment 6]

Figure 6:
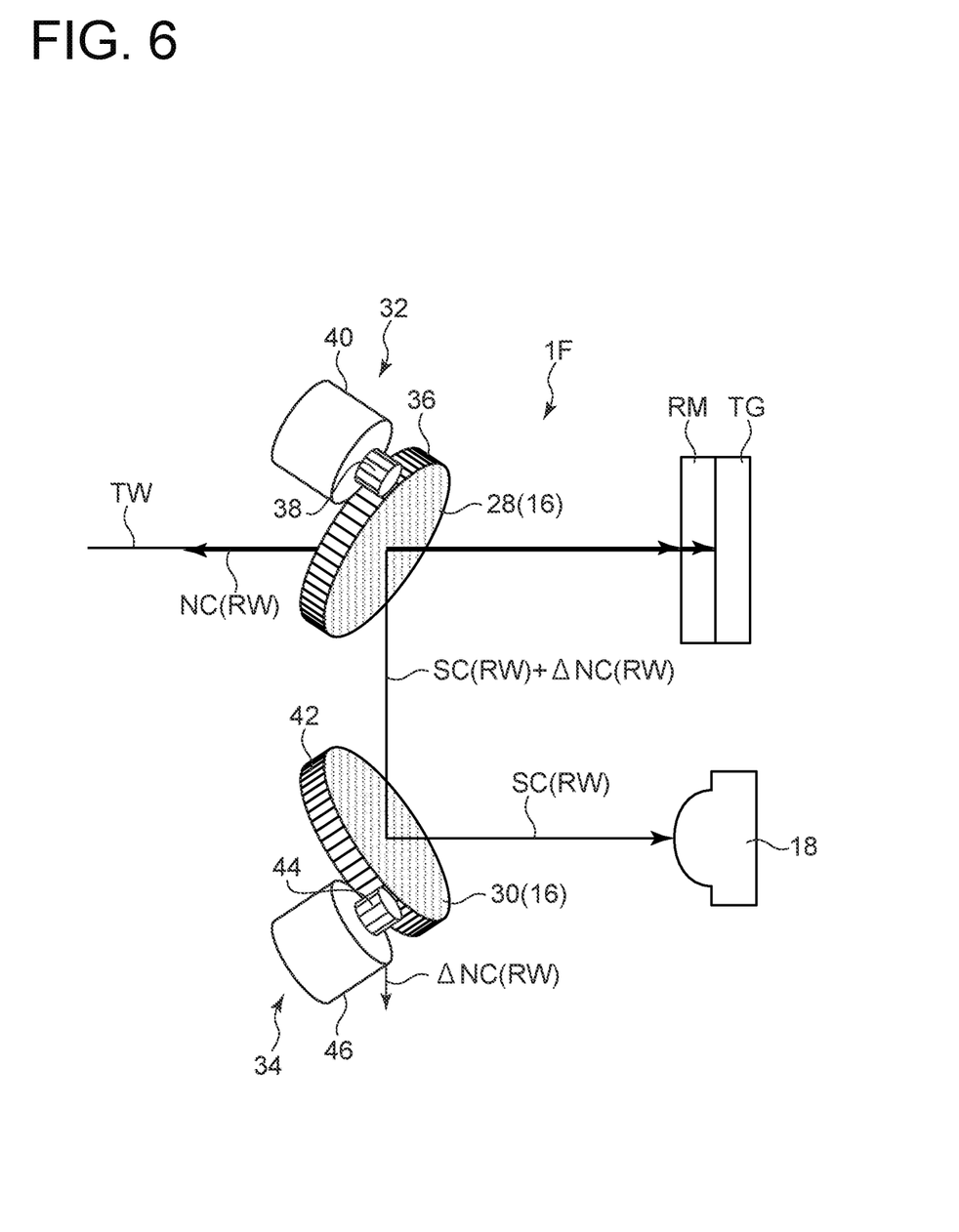
FIG. 6 is a view schematically showing the main part configuration of an inspection device according to Embodiment 6.

As shown in FIG. 6, in an inspection device 1F according to Embodiment 6, the first polarizer 28 includes a first rotating portion 32 for rotating the first polarizer 28 such that the plane of polarization of the terahertz wave TH rotates within a range of 90°, and the second polarizer 30 includes a second rotating portion 34 for rotating the second polarizer 30 such that the reflection component (signal component) SC reflected by the first polarizer 28 is rotated in the range of 90°. For example, the first polarizer 28 is disc-shaped and supported rotatably around a central axis of the first polarizer 28, and the first rotating portion 32 is composed of a gear 36 disposed on an outer circumference of the first polarizer 28 and an actuator 40 such as a motor for rotating a gear 38 meshing with the gear 36. Likewise, the second polarizer 30 is disc-shaped and supported rotatably around a central axis of the second polarizer 30, and the second rotating portion 34 is composed of a gear 42 disposed on an outer circumference of the second polarizer 30 and an actuator 46 such as a motor for rotating a gear 44 meshing with the gear 42. Other configurations are the same as those of any of the inspection devices 1A, 1B, 1C, 1E according to Embodiments 1 to 3 and 5.

[Operation of Inspection Device 1F]

Figure 7A:
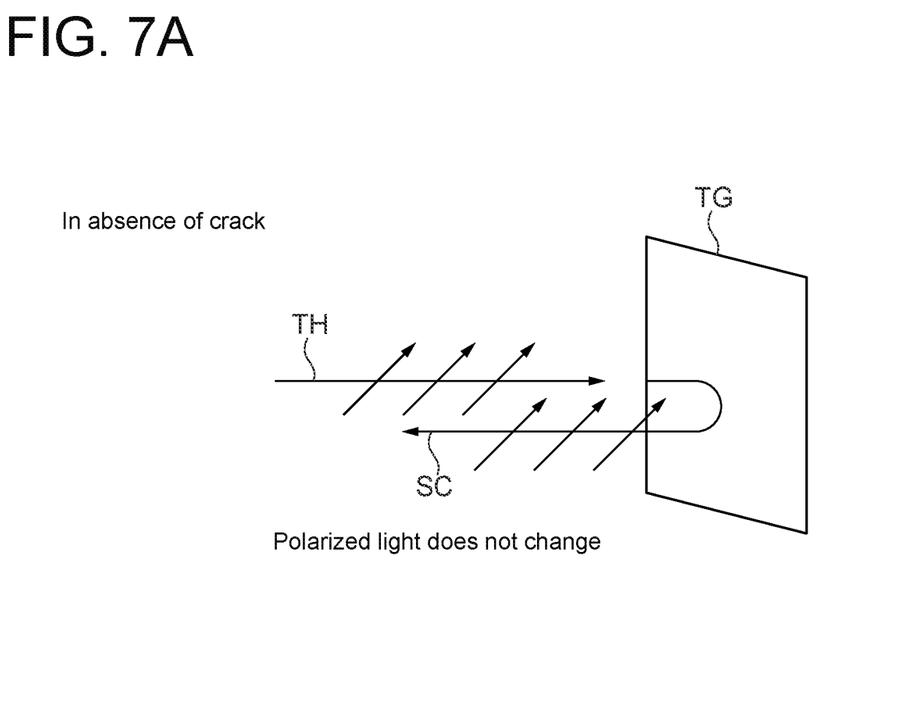
FIG. 7A is a view schematically illustrating an inspection principle.
Figure 7B:
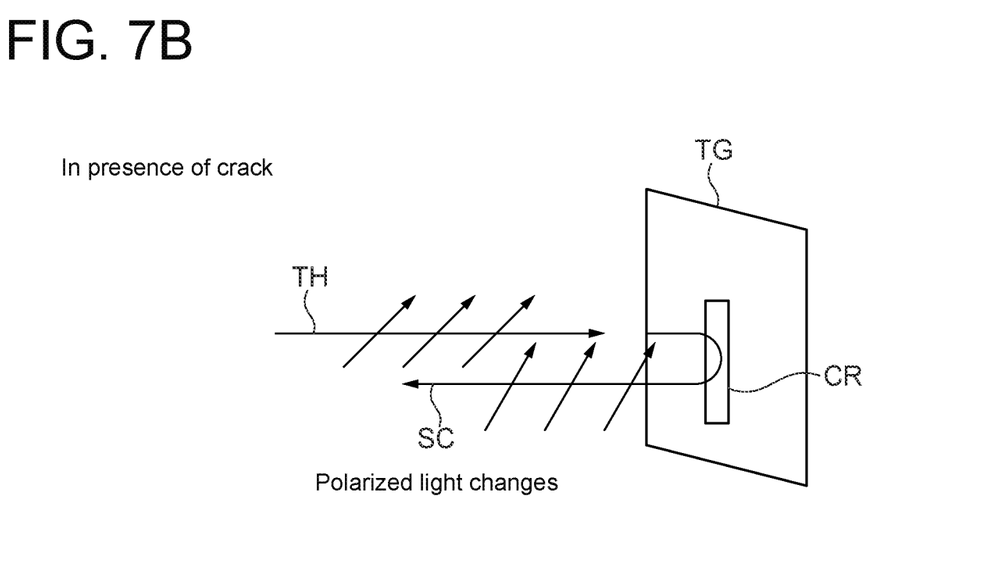
FIG. 7B is a view schematically illustrating an inspection principle.

As shown in FIG. 7A, if the inspection target TG does not have a crack CR, the plane of polarization of the reflection component SC reflected from the inspection target TG is the same as the plane of polarization of the incident terahertz wave TH (polarization does not change), but as shown in FIG. 7B, if the inspection target TG has the crack CR, the plane of polarization of the reflection component SC reflected from the inspection target TG becomes a plane of polarization where the plane of polarization of the incident terahertz wave TH is changed (polarization changes).

From a result of test verification, the present inventors have found that if the crack CR disposed in the inspection target TG is irradiated with the linearly polarized terahertz wave TH having the plane of polarization of 45°, contrast with a surrounding healthy part is obtained.

Thus, in an inspection device 1F according to Embodiment 6, in the inspection of the inspection target TG, the second rotating portion 34 rotates the second polarizer 30 such that the reflection component (signal component) SC reflected by the first polarizer 28 is rotated in the range of 90° while the first rotating portion 32 rotates the first polarizer 28 such that the plane of polarization of the terahertz wave TH rotates within the range of 90. Consequently, even if it is unknown whether there is the crack CR in the inspection target TG, it is possible to search for the crack CR by rotating the second polarizer 30 while rotating the first polarizer 28. Then, a maximum value of the reflection component (signal component) SC detected by the detector 18 is searched (MaxHold measurement).

Figure 8:
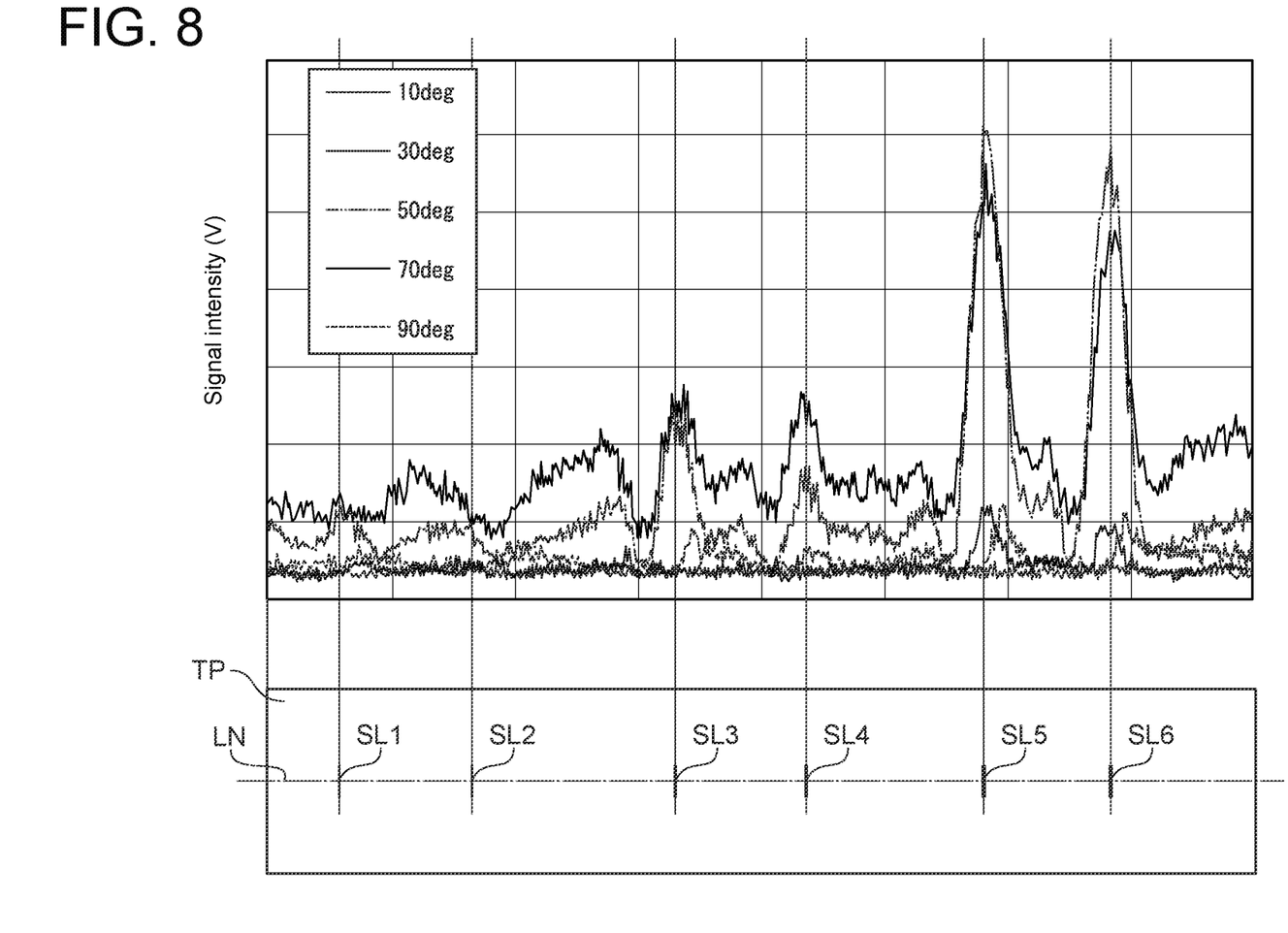
FIG. 8 is a view schematically showing an example of inspecting a test piece.

As shown in FIG. 8, in an example of inspecting a test piece TP having slits SL1 to SL6 on a line LN, if polarized light is adjusted at an angle of 45 degrees with respect to the slits SL1 to SL6 and is incident, signals of the slits SL1 to SL6 are detected in a range where the first polarizer 28 is at from 30 degrees to 70 degrees from a reference position. On the other hand, if the first polarizer 28 is at 10 degrees or 90 degrees (90) from the reference position, the signals of the slits SL1 to SL6 cannot be detected. Further, if there is a large difference in signal intensity at 30 degrees and at 50 degrees, since it is unknown how many degrees the actual crack CR is inclined, the maximum value of the reflection component (signal component) SC detected by the detector 18 is searched.

By thus searching for the maximum value of the reflection component (signal component) SC, it is possible to measure the maximum value of the reflection component (signal component) SC having the plane of polarization different from the plane of polarization of the terahertz wave TH, which can make the crack clear as shown in FIG. 8. Thus, even if the inspection target TG is an inspection target coated with a thermal barrier coating such as ceramics, the inspection target TG can be inspected without removing the thermal barrier coating. Other operations, that is, operations until the backscatter component (unwanted component) NC reflected by the surface of the low-permeable material RM and the reflection component reflected by the inspection target TG located in the lower layer of the low-permeable material RM enter the polarization part 16 (first polarizer 28) are the same as those of any of the inspection devices 1A, 1B, 1C, 1E according to Embodiments 1 to 3 and 5.

Embodiment 7

[Configuration of Inspection Device According to Embodiment 7]

Figure 9:
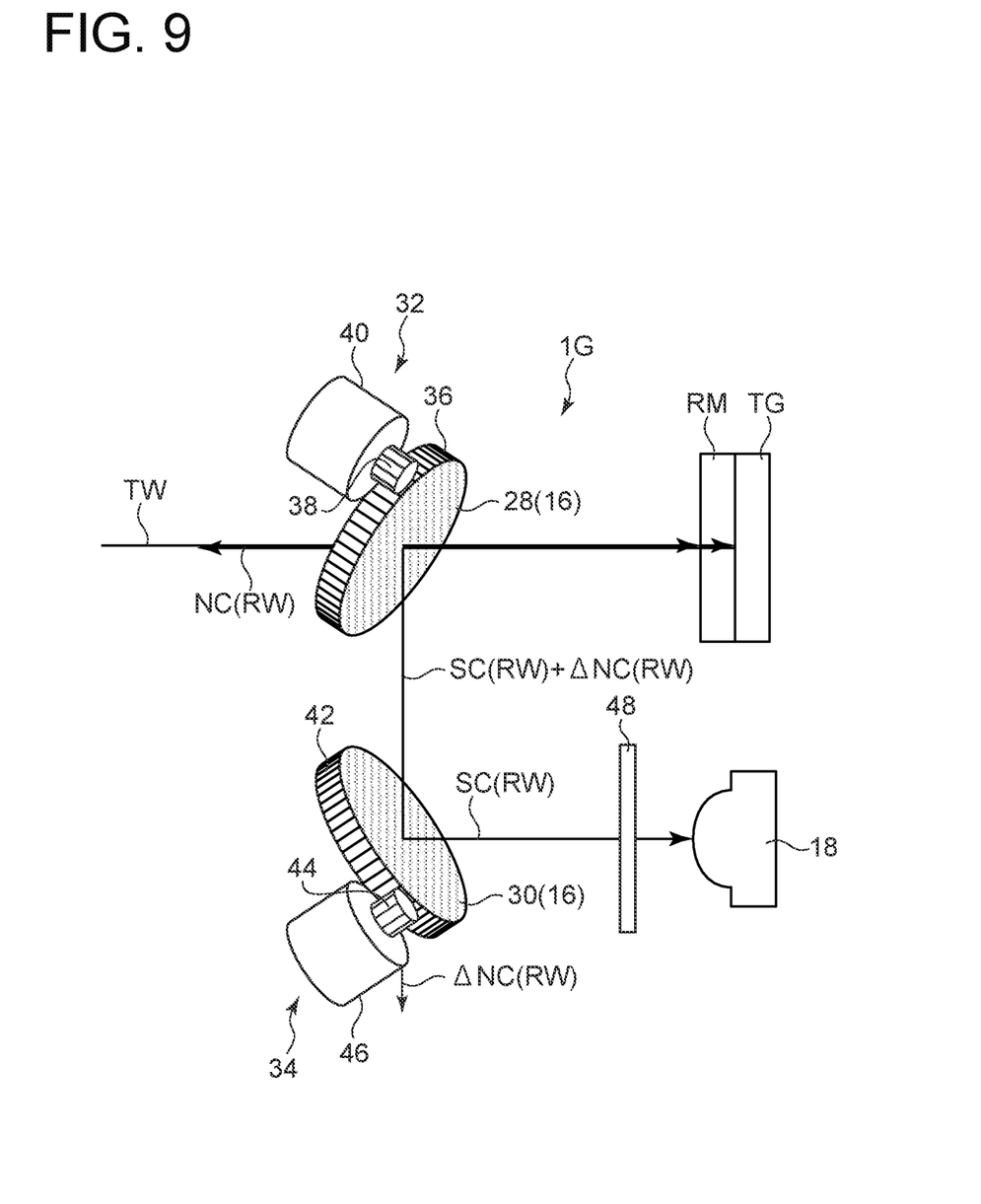
FIG. 9 is a view schematically showing the main part configuration of an inspection device according to Embodiment 7.

As shown in FIG. 9, in an inspection device 1G according to Embodiment 7, the detector 18 is a terahertz wave detector that is highly sensitive to circularly polarized light, and includes a quarter-wave plate 48 between the second polarizer 30 and the detector 18. For example, the quarter-wave plate 48 is made of quartz or the like. Other configurations are the same as those of any of the inspection devices 1A, 1B, 1C, 1E, 1F according to Embodiments 1 to 3, and 5 and 6.

[Operation of Inspection Device 1G]

In the inspection device 1G according to Embodiment 7, the reflection component (signal component) SC reflected by the second polarizer 30 is transmitted through the quarter-wave plate 48, thereby becoming the circularly polarized terahertz wave TH and entering the detector 18. The circularly polarized terahertz wave TH is detected by the detector 18 that is highly sensitive to the circularly polarized light, and a value (signal value) of the reflection component (signal component) increases.

Since the detector 18 includes the quarter-wave plate 48 between the second polarizer 30 and the detector 18 if the detector 18 is the terahertz wave detector that is highly sensitive to the circularly polarized light as described above, it is possible to increase the value (signal value) of the reflection component (signal component) detected by the detector 18. Other operations, that is, operations until the reflection component (signal component) SC reflected by the inspection target TG is reflected by the second polarizer 30 are the same as those of any of the inspection devices 1A, 1B, 1C, 1E, 1G according to Embodiments 1 to 3, and 5 and 6.

Embodiment 8

[Configuration of Inspection Device According to Embodiment 8]

Figure 10:
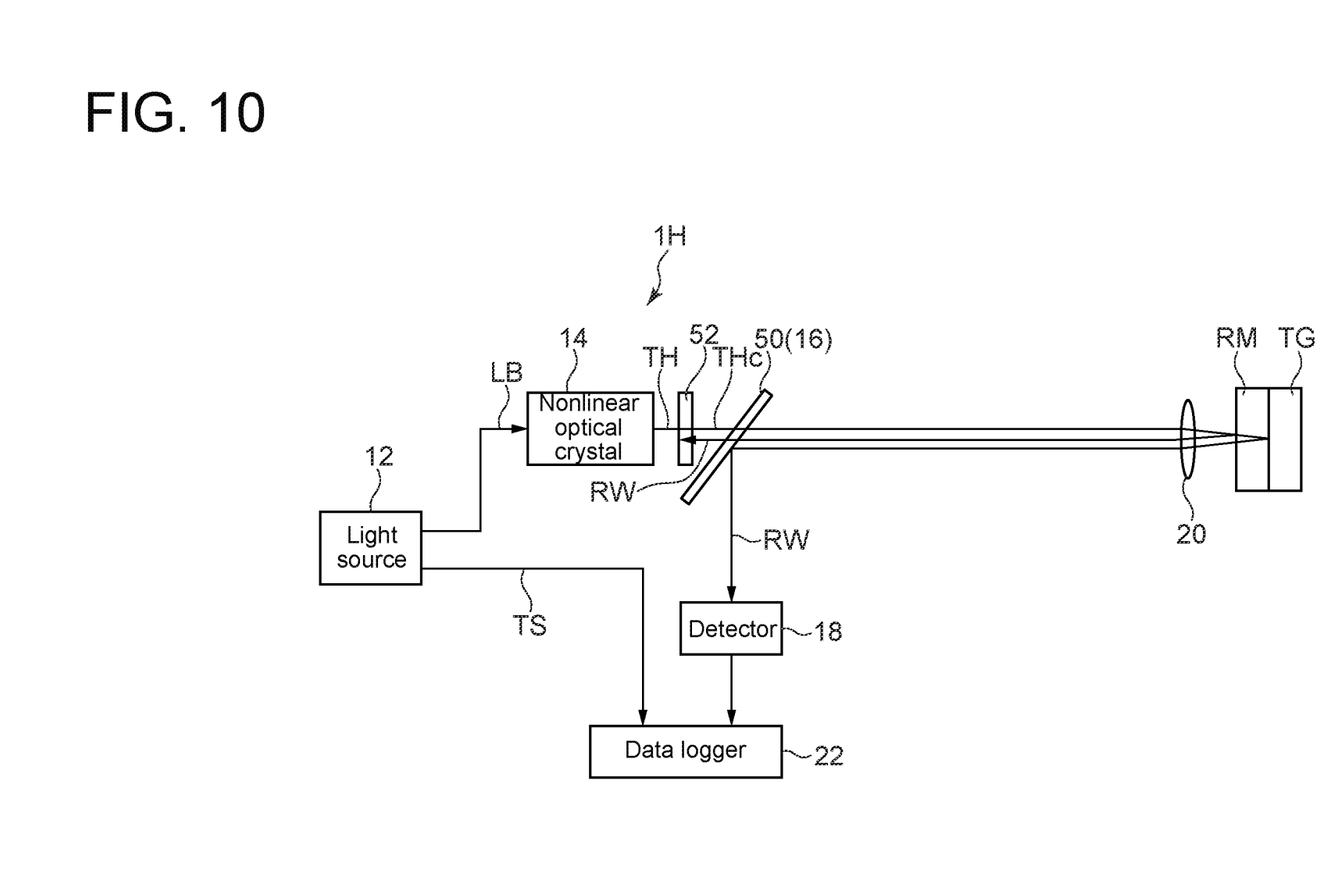
FIG. 10 is a view schematically showing the configuration of an inspection device according to Embodiment 8.

As shown in FIG. 10, in an inspection device 1H according to Embodiment 7, the terahertz wave TH is a circularly polarized wave, and the polarization part 16 includes a half mirror 50 for reflecting the reflected wave RW. The inspection device 1G includes a quarter-wave plate 52 at an output end of the nonlinear optical crystal 14, that is, between the nonlinear optical crystal 14 and the half mirror 50. For example, the quarter-wave plate 52 is made of quartz or the like. Other configurations are the same as those of any of the inspection devices 1A, 1B, 1C according to Embodiments 1 to 3.

[Operation of Inspection Device 1H]

In the inspection device 1H according to Embodiment 7, in the inspection of the inspection target TG, the linearly polarized terahertz wave TH having undergone optical wavelength conversion in the nonlinear optical crystal 14 is transmitted through the quarter-wave plate 52, thereby becoming a circularly polarized terahertz wave THc and being emitted to the inspection target TG. The reflected wave RW reflected by the inspection target TG is reflected by the half mirror 50, detected by the detector 18, and used for the inspection of the inspection target. In Embodiments 6 and 7, it is required to irradiate the crack disposed in the inspection target with the linearly polarized wave with the plane of polarization of 45 degrees. However, constant sensitivity of the circularly polarized terahertz wave THc to the crack in the inspection target TG can be expected regardless of the plane of polarization. Accordingly, since there is no need to search for the maximum value of the reflection component (signal component) SC, shortening of a measurement time can also be expected compared to Embodiments 6 and 7. Other operations are the same as those of any of the inspection devices 1A, 1B, 1C according to Embodiments 1 to 3.

The contents described in the above embodiments would be understood as follows, for instance.

An inspection device (1A to 1H) according to an aspect of [1] includes: a light source (12) for outputting pulsed excitation light with a time width of 10 picoseconds to 10 nanoseconds; a nonlinear optical crystal (14) for generating a terahertz wave (TH) by optical wavelength conversion of the pulsed excitation light; a polarization part (16) for reflecting at least a part of a reflected wave (RW) of the terahertz wave (TH) reflected by an inspection target (TG); and a detector (18) for detecting the reflected wave (RW) reflected by the polarization part (16).

With such configuration, the backscatter component (unwanted component) (NC) reflected by the surface of the low-permeable material (RM) is transmitted through the polarization part (16), and the reflection component (signal component) (SC) reflected by the inspection target (TG) located in the lower layer of the low-permeable material (RM) is reflected by the polarization part (16). Consequently, the backscatter component (unwanted component) (NC) reflected by the surface of the low-permeable material (RM) and the reflection component (signal component) (SC) from the inspection target (TG) are separated from each other. Thus, the reflection component (signal component) (SC) from the inspection target (TG) can be detected by the detector (18), making it possible to inspect the inspection target (TG).

[2] An inspection device (1D) according to another aspect is the inspection device as defined in [1], wherein the terahertz wave (TH) is a linearly polarized wave, and wherein the polarization part (16) includes: a first polarizer (24) for reflecting a component of the reflected wave (RW) having a plane of polarization different from a plane of polarization of the terahertz wave (TH); and a second polarizer (26) for transmitting the component reflected by the first polarizer (24).

With such configuration, since most of the backscatter component (unwanted component) (NC) reflected by the surface of the low-permeable material (RM) is transmitted through the first polarizer (24) and the reflection component (signal component) (SC) reflected by the inspection target (TG) located in the lower layer of the low-permeable material (RM) is reflected by the first polarizer (24), the backscatter component (unwanted component) (NC) reflected by the surface of the low-permeable material (RM) and the reflection component (signal component) (SC) are separated from each other. Then, the unwanted component (backscatter component) that has not been separated by the first polarizer (24) is reflected by the second polarizer (26) and the reflection component (signal component) (SC) reflected by the inspection target (TG) is transmitted through the second polarizer (26), separating the unwanted component that has not been separated by the first polarizer (24) from the reflection component (signal component) (SC) reflected by the inspection target (TG). Consequently, noise of the reflection component (signal component) (SC) from the inspection target (TG) is reduced and detection accuracy of the detector (18) is improved, allowing for highly accurate inspection.

[3] An inspection device (1E) according to another aspect is the inspection device as defined in [1], wherein the terahertz wave (TH) is a linearly polarized wave, and wherein the polarization part (16) includes: a first polarizer (28) for reflecting a component of the reflected wave (RW) having a plane of polarization different from a plane of polarization of the terahertz wave (TH); and a second polarizer (30) for reflecting the component reflected by the first polarizer (28).

With such configuration, since most of the backscatter component (unwanted component) (NC) reflected by the surface of the low-permeable material (RM) is transmitted through the first polarizer (28) and the reflection component (signal component) (SC) reflected by the inspection target (TG) located in the lower layer of the low-permeable material (RM) is reflected by the first polarizer (28), the backscatter component (unwanted component) (NC) on the surface of the low-permeable material (RM) and the reflection component (signal component) (SC) from the inspection target (TG) can be separated from each other. Then, although the reflection component (signal component) (SC) from the inspection target (TG) reflected by the first polarizer (28) is reflected by the second polarizer (30), Mie scattering light (unwanted wave) generated by the first polarizer (28) (wire grid) is smaller in backward scatter (equivalent to reflection from the viewpoint of the second polarizer) than in forward scatter (equivalent to transmission in the second polarizer), allowing the Mie scattering light generated by the first polarizer (28) to be less picked up. Consequently, the noise of the reflection component reflected by the inspection target (TG) is reduced and the detection accuracy of the detector (18) is improved, allowing for highly accurate inspection.

[4] An inspection device (1F) according to another aspect is the inspection device as defined in [3], wherein the first polarizer (28) includes a first rotating portion (32) for rotating the first polarizer (28) such that the plane of polarization of the terahertz wave (TH) rotates in a range of 90°, and wherein the second polarizer (30) includes a second rotating portion (34) for rotating the second polarizer (30) such that the component reflected by the first polarizer (28) rotates in the range of 90°.

By thus configuring, it is possible to measure the maximum value of the reflection component having the plane of polarization different from the plane of polarization of the terahertz wave (TH), and it is possible to clarify a crack whose crack direction is unknown.

[5] An inspection device (1G) according to another aspect is the inspection device as defined in [3] or [4], including a quarter-wave plate (48) between the second polarizer (30) and the detector (18).

With such configuration, since the detector (18) includes the quarter-wave plate (48) between the second polarizer (30) and the detector (18) if the detector (18) is the terahertz wave detector that is highly sensitive to the circularly polarized light, it is possible to increase the value (signal value) of the reflection component (signal component) detected by the detector (18).

[6] An inspection device (1H) according to another aspect is the inspection device as defined in [1], wherein the terahertz wave (TH) is a circularly polarized wave, wherein the polarization part (16) includes a half mirror (50) for reflecting the reflected wave (RW), and wherein the inspection device (1G) includes a quarter-wave plate (52) at an output end of the nonlinear optical crystal (14).

With such configuration, the linearly polarized terahertz wave (TH) having undergone optical wavelength conversion in the nonlinear optical crystal (14) is transmitted through the quarter-wave plate (52), thereby becoming a circularly polarized terahertz wave (THc) and being emitted to the inspection target (TG). The circularly polarized terahertz waves (THc) can be expected to have a certain sensitivity regardless of the crack direction of the inspection target (TG), and thus shortening of a measurement time can also be expected.

[7] An inspection device (1B to 1G) according to another aspect is the inspection device as defined in any one of [1] to [6], including a condenser lens (20) for collecting the terahertz wave to irradiate the inspection target (TG) with the terahertz wave (TH).

With such configuration, since the terahertz wave (TH) emitted from the nonlinear optical crystal (14) is collected by the condenser lens (20) and emitted to the inspection target (TG), the terahertz wave (TH) is collected to the inspection target (TG), and the reflection component (signal component) (SC) with high resolution can be detected in the detector (18).

[8] An inspection device (1C to 1H) according to another aspect is the inspection device as defined in any one of [1] to [7], including a data logger (22) for storing the reflected wave (RW) detected by the detector (18). A trigger signal (TS) is transmitted to the data logger (22) simultaneously with the output of the excitation light from the light source (12), and the data logger (22) is configured to store the reflected wave (RW) when receiving the trigger signal (TS).

With such configuration, since the data logger (22) stores the data of the reflection component (signal component) (SC) when receiving the trigger signal (TS), the data amount of the reflection component (signal component) (SC) stored in the data logger (22) can be reduced compared to a case where the data logger (22) continuously stores the data of the reflection component (signal component) (SC).

The invention claimed is:

1. An inspection device comprising:
a light source for outputting pulsed excitation light with a time width of 10 picoseconds to 10 nanoseconds;
a nonlinear optical crystal for generating a terahertz wave by optical wavelength conversion of the pulsed excitation light;
a polarization part for reflecting at least a part of a reflected wave of the terahertz wave reflected by an inspection target; and
a detector for detecting the reflected wave reflected by the polarization part,
wherein the terahertz wave is a linearly polarized wave, and
wherein the polarization part includes:
a first polarizer for reflecting a component of the reflected wave having a plane of polarization different from a plane of polarization of the terahertz wave; and
a second polarizer for transmitting the component reflected by the first polarizer.

2. The inspection device according to claim 1, further comprising a condenser lens for collecting the terahertz wave to irradiate the inspection target with the terahertz wave.

3. The inspection device according to claim 1, further comprising a data logger for storing the reflected wave detected by the detector,
wherein a trigger signal is transmitted to the data logger simultaneously with the output of the pulsed excitation light from the light source, and the data logger is configured to store the reflected wave when receiving the trigger signal.

4. An inspection device comprising:
a light source for outputting pulsed excitation light with a time width of 10 picoseconds to 10 nanoseconds;
a nonlinear optical crystal for generating a terahertz wave by optical wavelength conversion of the pulsed excitation light;
a polarization part for reflecting at least a part of a reflected wave of the terahertz wave reflected by an inspection target; and
a detector for detecting the reflected wave reflected by the polarization part,
wherein the terahertz wave is a linearly polarized wave, and
wherein the polarization part includes:
a first polarizer for reflecting a component of the reflected wave having a plane of polarization different from a plane of polarization of the terahertz wave; and
a second polarizer for reflecting the component reflected by the first polarizer.

5. The inspection device according to claim 4,
wherein the first polarizer includes a first rotating portion for rotating the first polarizer such that the plane of polarization of the terahertz wave rotates in a range of 90°, and
wherein the second polarizer includes a second rotating portion for rotating the second polarizer such that the component reflected by the first polarizer rotates in the range of 90°.

6. The inspection device according to claim 4, further comprising a quarter-wave plate between the second polarizer and the detector.

7. The inspection device according to claim 4, further comprising a condenser lens for collecting the terahertz wave to irradiate the inspection target with the terahertz wave.

8. The inspection device according to claim 4, further comprising a data logger for storing the reflected wave detected by the detector,
wherein a trigger signal is transmitted to the data logger simultaneously with the output of the pulsed excitation light from the light source, and the data logger is configured to store the reflected wave when receiving the trigger signal.

* * * * *